(12) United States Patent
Reboh et al.

(10) Patent No.: US 11,688,629 B2
(45) Date of Patent: Jun. 27, 2023

(54) LOW-TEMPERATURE METHOD FOR MANUFACTURING A SEMICONDUCTOR-ON-INSULATOR SUBSTRATE

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Jean-Michel Hartmann, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/456,607

(22) Filed: Nov. 26, 2021

(65) Prior Publication Data
US 2022/0172984 A1   Jun. 2, 2022

(30) Foreign Application Priority Data

Nov. 27, 2020   (FR) ..................................... 20 12257

(51) Int. Cl.
*H01L 21/762* (2006.01)
*H01L 21/02* (2006.01)

(52) U.S. Cl.
CPC .. *H01L 21/76254* (2013.01); *H01L 21/02532* (2013.01)

(58) Field of Classification Search
None
See application file for complete search history.

(56) References Cited

U.S. PATENT DOCUMENTS

| | | |
|---|---|---|
| 6,323,108 B1 | 11/2001 | Kub et al. |
| 9,735,062 B1 | 8/2017 | Doris et al. |
| 2010/0003803 A1 | 1/2010 | Oka et al. |
| 2022/0172984 A1* | 6/2022 | Reboh ................ H01L 27/1203 |

OTHER PUBLICATIONS

Extended European Search Report dated Apr. 22, 2022 in European Patent Application No. 21306639.2, 9 pages.

* cited by examiner

*Primary Examiner* — Jack S Chen
(74) *Attorney, Agent, or Firm* — Oblon, McClelland, Maier & Neustadt, L.L.P.

(57) ABSTRACT

A method for producing a semiconductor-on-insulator type substrate includes epitaxial deposition of a first semiconductor layer on a smoothing layer supported by a monocrystalline support substrate to form a donor substrate; production of an assembly by contacting the donor substrate with a receiver substrate; transfer, onto the receiver substrate, of the first semiconductor layer, the smoothing layer and a portion of the support substrate; and selective etching of the portion of the support substrate relative to the smoothing layer. The epitaxial deposition of the first semiconductor layer can be preceded by a surface preparation annealing of the support substrate at a temperature greater than 650° C. After the selective etching of the portion of the support substrate, selective etching of the smoothing layer relative to the first semiconductor layer and epitaxial deposition of a second semiconductor layer on the first semiconductor layer may be carried out in an epitaxy frame.

16 Claims, 5 Drawing Sheets

FIG. 7 ial layer intended to be used for the manufacture of a second level of components.

PRIOR ART

In general, in the field of integrated circuits, it is continually sought to increase the density of transistors. For this, one solution consists in distributing the transistors over several levels of semiconductor layers disposed one above the other to form a 3D device. Such a 3D device thus generally includes a lower level provided with a first semiconductor layer from which transistors are formed and at least one upper level provided with at least one second semiconductor layer from which transistors are formed, the first and the second semiconductor layers being stacked.

The production of the 3D device can involve the implementation of a step of assembling a lower level in which transistors have for example already been produced and of a silicon on insulator (SOI) substrate in which the semiconductor layer of a higher level is found. The assembly between the SOI substrate and the lower level is generally performed by bonding.

The SOI substrate is then thinned to the upper level semiconductor layer. This thinning can be carried out by etching the rear face of the SOI substrate. Alternatively, the upper level semiconductor layer can be transferred onto the lower level in accordance with the Smart Cut™ method from the SOI substrate. This transfer comprises, prior to bonding, implanting ionic species in the SOI substrate so as to form an embrittlement plane and, after bonding, fracturing the SOI substrate along the embrittlement plane.

In both cases, the buried oxide (BOX) layer of the SOI substrate is used as a thinning etching barrier layer, which allows obtaining a thin semiconductor silicon layer of uniform thickness. However, these two methods have the drawback of being relatively expensive due to the manufacturing cost of the SOI substrate.

One solution to reducing these costs would consist in manufacturing the upper lever semiconductor layer by Smart Cut™ not from a SOI substrate, but directly from a bulk silicon substrate.

In order to ensure a rectification of the post-fracture surface roughness and to thin the semiconductor layer to the desired thickness, methods such as thermal oxidations having a significant thermal budget, for example in the range of 900-1200° C., are conventionally carried out. However, such a thermal budget can lead to a degradation of the components of the lower level such that these methods are not suitable for the design of 3D circuits.

It is also necessary to eliminate defects which are likely to affect the mobility of charge carriers which have been introduced by the implantation of ionic species into the crystalline matrix of the upper level semiconductor layer. Curing these defects can conventionally be obtained by means of a heat treatment at temperatures greater than 900° C. Such a heat treatment is also likely to degrade the components of the lower level, and this curing cannot therefore be implemented within the framework of a design of 3D devices.

Figure 1:
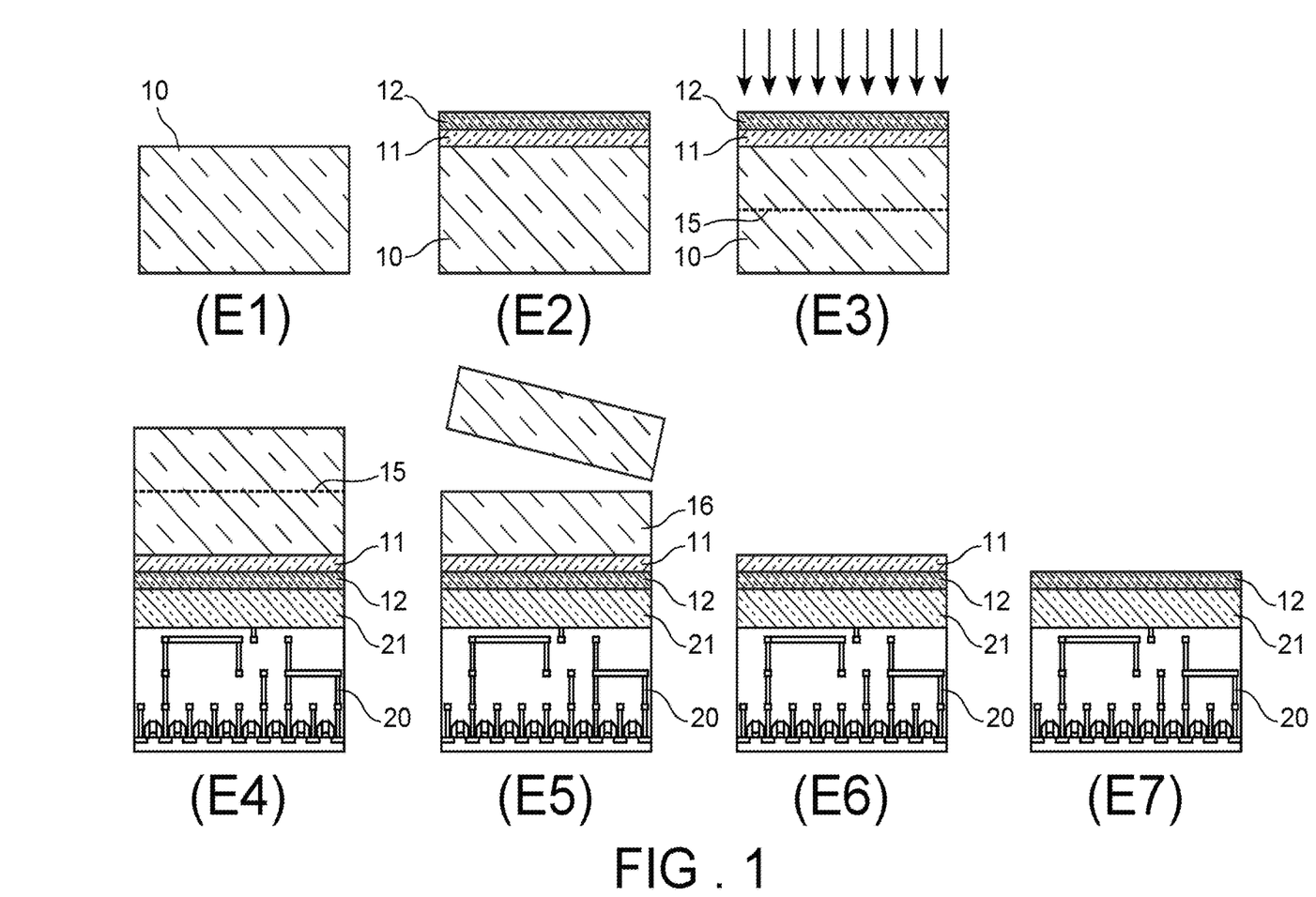
FIG. 1 which is already previously commented, illustrates a low temperature method of the related art.

One solution allowing ensuring, at a sufficiently low temperature, the rectification of the post-fracture surface roughness and thinning the semiconductor layer to the desired thickness consists in using an etching barrier layer in the bulk silicon substrate. As represented in FIG. 1, this solution comprises during a step (E1) by providing a bulk silicon substrate 10. During a step (E2), a SiGe layer 11 and a Si layer 12 are successively formed by epitaxy on the bulk silicon substrate 10. During a step (E3), the implantation of ionic species, for example hydrogen and/or helium, is carried out in the bulk silicon substrate 10 so as to form an embrittlement plane 15 therein. During a step (E4), the bulk silicon substrate 10 is bonded to a receiver substrate 20, a dielectric layer 21 being at the bonding interface. Then during a step (E5), the bulk silicon substrate is detached along the embrittlement plane 15, thus causing the transfer of the Si layer 12, of the SiGe layer 11 and of a portion 16 of the bulk silicon substrate on the receiver substrate 20. The structure obtained at the end of the transfer is subjected to a finishing treatment which comprises during a step (E6) a first wet etching of the portion 16 of the bulk silicon substrate which is on the surface of said structure, said first etching being selective relative to the material of the SiGe layer 11. This finishing treatment then comprises, during a step (E7), a second wet etching of the SiGe layer 11 which is at the surface of the structure obtained at the end of the first etching, said second etching being selective relative to the material of the Si layer 12. This finishing treatment produces a smoothing and a thinning. However, the transferred Si layer 12 still have defects which are likely to affect its electrical properties.

DISCLOSURE OF THE INVENTION

An objective of the invention is to propose a method for designing 3D devices in which the upper level crystalline layer would be obtained by transfer from a bulk silicon substrate and in which the rectification of the post-fracture surface roughness, the control of the thickness of the transferred layer and the curing the defects present therein could be obtained without degradation of the components of the lower level.

To do this, it proposes a method for producing a semiconductor-on-insulator type substrate, comprising the following steps:

successive epitaxial deposition of a smoothing layer and of a first semiconductor layer on a monocrystalline support substrate to form a donor substrate, the smoothing layer forming an etching barrier layer relative to the support substrate material;

production of an assembly by contacting the donor substrate with a receiver substrate;

transfer, onto the receiver substrate, of the first semiconductor layer, the smoothing layer and a portion of the support substrate;

production of a selective etching of said portion of the support substrate relative to the smoothing layer.

This method further comprises, after the selective etching of said portion of the support substrate, carrying out the following steps in an epitaxy frame:

selective etching of the smoothing layer relative to the first semiconductor layer;

epitaxial deposition of a second semiconductor layer on the first semiconductor layer;

Within the scope of the invention, the steps of selective etching of the smoothing layer and of epitaxial deposition of the second semiconductor layer are carried out in the same epitaxy frame, without re-venting and at temperatures less than or equal to 500° C.

Some preferred but non-limiting aspects of this method are as follows:

the epitaxial deposition of the smoothing layer is preceded by a surface preparation annealing of the monocrystalline support substrate at a temperature greater than 650° C., preferably under $H_2$;

the surface preparation annealing of the monocrystalline support substrate is carried out at a temperature greater than 800° C.;

the surface preparation annealing of the monocrystalline support substrate is preceded by a step of removing a native oxide present on the surface of said support substrate;

the selective etching of the smoothing layer relative to the first semiconductor layer is a vapour phase etching;

the monocrystalline support substrate is a monocrystalline Si substrate, the smoothing layer is a SiGe layer and the first semiconductor layer is a monocrystalline Si layer;

the smoothing layer has a Ge concentration comprised between 20 and 60%;

the monocrystalline support substrate is a monocrystalline Si substrate, the smoothing layer is a SiGe layer and the first semiconductor layer is a SiGe layer of a lower Ge concentration than the smoothing layer;

the Ge concentration of the first semiconductor layer is at least 20% lower than the Ge concentration of the smoothing layer;

the epitaxial deposition of the second semiconductor layer is preceded by a surface preparation annealing of the receiver substrate of the first semiconductor layer at a temperature less than or equal to 500° C., preferably under $H_2$;

it comprises, before producing the assembly, a step of thermal oxidation of the first semiconductor layer at a temperature less than 900° C., said thermal oxidation forming a dielectric layer with a thickness comprised between 5 nm and 50 nm;

it comprises, before producing the assembly, a step of plasma oxidation of the first semiconductor layer at a temperature less than 500° C., said plasma oxidation forming a dielectric layer;

it further comprises, before the assembly production step, a step of implanting ionic species in the support substrate so as to form an embrittlement plane therein and the transfer step comprises detaching the support substrate along the embrittlement plane;

the receiver substrate integrates a level of microelectronic components;

the following subsequent steps are also provided:

localised etching of a first portion of the second semiconductor layer so as to free an area from the smoothing layer;

epitaxial deposition of a third semiconductor layer on at least one portion of the area freed from the smoothing layer.

the steps of localised etching of the first portion of the second semiconductor layer and of epitaxial deposition of the third semiconductor layer are produced in the same epitaxy frame, without re-venting and are conducted at temperatures less than or equal to 500° C.;

the portion of the area freed from the smoothing layer, on which the third semiconductor layer is formed, is a portion which is at a distance from a portion of second semiconductor layer which remains after the step of selective etching of the first portion of the second semiconductor layer;

there is further provided a step of prior localised etching of the smoothing layer and of the second semiconductor layer in order to form an area free from smoothing layer and second semiconductor layer, the prior localised etching step being prior to the step of forming the third semiconductor layer and being carried out such that the area free from smoothing layer and second semiconductor layer is intended to separate the third semiconductor layer from the second semiconductor layer;

the third semiconductor layer is made of a material distinct from that of the second semiconductor layer by at least one of the following characteristics:
a chemical composition,
a conductivity type,
a concentration of doping elements.

the second semiconductor layer preferably comprising a silicon-germanium alloy with a conductivity type for which the majority carriers are electrons, the third semiconductor layer advantageously comprising silicon with a conductivity type for which the majority carriers are holes.

BRIEF DESCRIPTION OF THE DRAWINGS

Other aspects, aims, advantages and features of the invention will become more apparent on reading the following detailed description of preferred embodiments thereof, given by way of non-limiting example, and made with reference to the appended drawings in which.

DETAILED DESCRIPTION

The invention relates to a method for producing a substrate, in particular a semiconductor-on-insulator type substrate, by transferring a semiconductor layer onto a receiver substrate.

In a preferred application of the invention, the method allows designing a 3D device with stacked microelectronic components with a receiver substrate which integrates components which are already manufactured on a first level. The transferred semiconductor layer can be used as an active layer for manufacturing components on a level stacked on the first level. The transferred semiconductor layer can for example constitute a channel region for one or more transistor(s).

Figure 2:
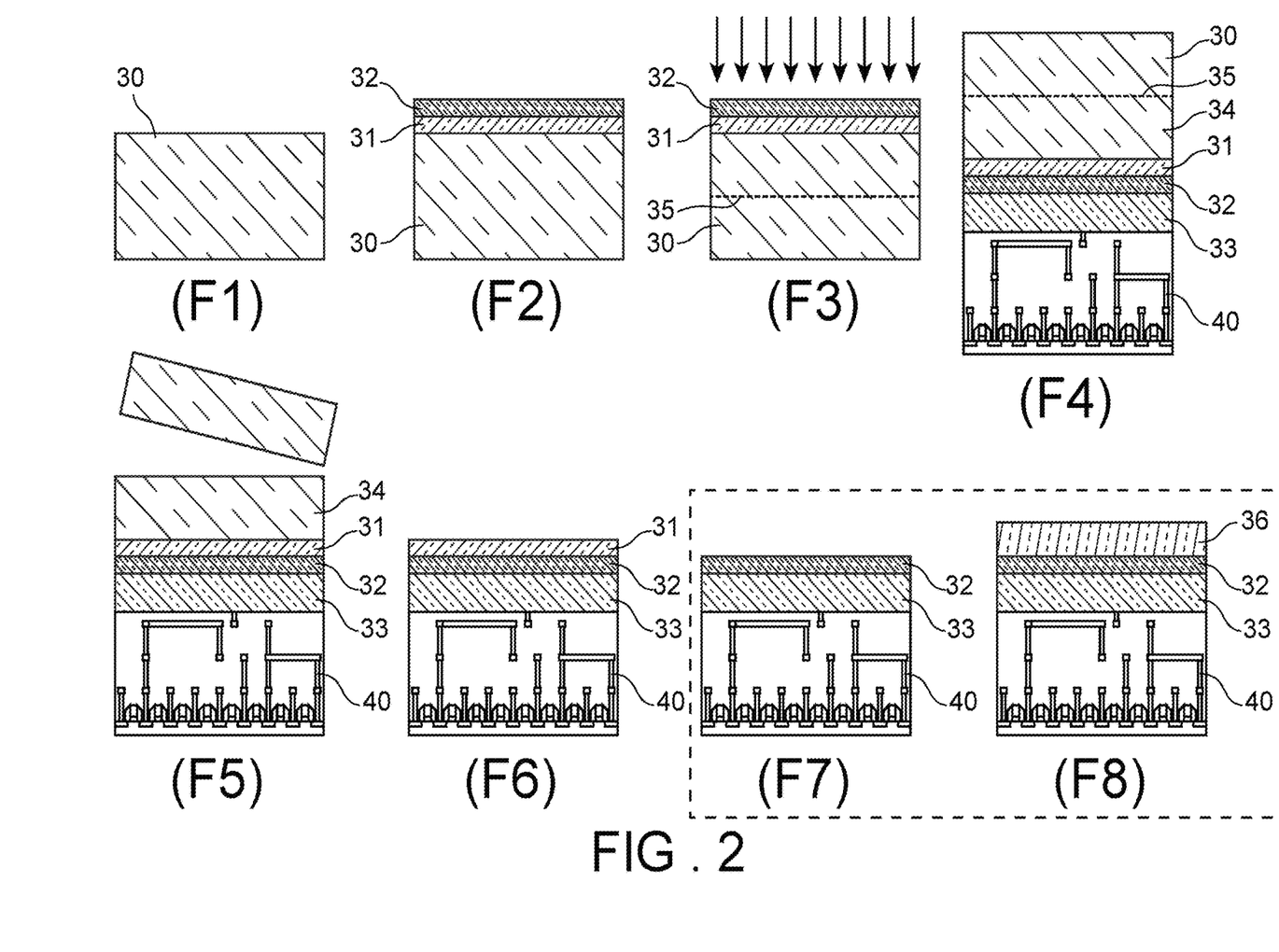
FIG. 2 illustrates an exemplary embodiment of a method in accordance with the invention.

A possible implementation of the method according to the invention is illustrated in FIG. 2. This method starts in a step (F1) by providing a monocrystalline support substrate 30. A smoothing layer 31 and a first monocrystalline semiconductor layer 32 are formed successively, by epitaxy in the same epitaxy frame on the monocrystalline support substrate. There is thus no exposure to air or to any other contaminating environment between the epitaxy of the smoothing layer 31 and the epitaxy of the first monocrystalline semiconductor layer 32. A donor substrate is thus formed which comprises the monocrystalline support substrate 30, the smoothing layer 31 and the first monocrystalline semiconductor layer 32, the latter being arranged on the surface of said substrate.

Advantageously, the epitaxial deposition of the smoothing layer 31 on the support substrate 30 is preceded, after removal of the native oxide present on the surface of the support substrate 30, by surface preparation annealing of the monocrystalline support substrate 30, usually under $H_2$, at a temperature greater than 650° C., preferably greater than 800° C. The removal of the native oxide can be carried out by wet chemical process, for example thanks to an immersion in hydrofluoric acid diluted in water, or by means of a plasma based on $NH_3/NF_3$ (with conversion native oxide or a chemical/thermal oxide to oxide salt and sublimation at temperatures below 200° C.). The inventors have indeed been able to note that such a high temperature surface preparation annealing allows obtaining an adequate surface in terms of cleaning, decontamination and elimination of residual contaminants such as C, O or F. Thus, wherever an annealing at a temperature below 650° C. will lead to the epitaxial growth of a layer having a significant microdefectivity, an annealing at a temperature greater than 650° C. will allow the low temperature epitaxial growth (typically below 500° C.) of a layer having an acceptable microdefectivity.

The smoothing layer 31 forms an etching barrier layer relative to the material of the support substrate 30 and the material of the first monocrystalline semiconductor layer 32. For this purpose, the smoothing layer 31 is made of a material having a chemical composition different from that of the support substrate 30 and of the first monocrystalline semiconductor layer 32, the choice of the materials being able to be performed according to the nature of the etching agent and the desired selectivity.

According to one preferred embodiment, the support substrate 30 comprises a first material identical to that of the first monocrystalline semiconductor layer 32 and the smoothing layer 31 comprises a second monocrystalline material different from the first material. The first material is typically silicon, the second material possibly being silicon-germanium, for example.

Preferably, the thickness and the germanium content of the smoothing layer 31 are selected so as to obtain a pseudomorphic layer, i.e. of a thickness less than the critical plastic relaxation thickness, which limits the risk of generating crystalline defects such as dislocations. Thus, the thickness of the smoothing layer is typically comprised between 5 and 120 nm, preferably comprised between 10 and 50 nm. According to a particular embodiment of the invention, the germanium content in the smoothing layer is comprised between 20 and 60%, preferably between 20 and 40%. The thickness of the first monocrystalline semiconductor layer 12 is typically comprised between 5 and 100 nm.

In a variant, the monocrystalline support substrate 30 is a monocrystalline Si substrate, the smoothing layer 31 is a SiGe layer and the first semiconductor layer 32 is a SiGe layer of lower Ge concentration than the smoothing layer 31. For example, the Ge concentration of the first semiconductor layer 32 is at least 20% lower than the Ge concentration of the smoothing layer 31.

According to one embodiment, the donor substrate is covered with a bonding layer, for example a dielectric layer. Alternatively or in addition, the bonding layer may be an amorphous Si or Ge layer and/or consist of one or more metal layer(s), or any other layer allowing a molecular bonding method. A dielectric bonding layer can in particular be a layer of an oxide or a nitride of a semiconductor material. The dielectric bonding layer will form all or part of the buried insulating layer of the semiconductor-on-insulator substrate. A possible formation of this dielectric layer on the donor substrate will be described below.

Alternatively, the donor substrate is not covered with such a bonding layer and it is the free surface thereof which forms the surface of the donor substrate. In this case, a bonding layer can be formed on a receiver substrate to which the donor substrate will be bonded in order to transfer the semiconductor layer. Alternatively, a bonding layer may be present on both the donor substrate and the receiver substrate.

The method then comprises during a step (F3) an implantation of ionic species, for example hydrogen and/or helium, in the support substrate 30 so as to form therein an embrittlement plane 35 separating a portion to be transferred by the Smart Cut™ method (formed of the first monocrystalline semiconductor layer 32, of the smoothing layer 31 and of a portion 34 of the support substrate) from a bulk portion of the support substrate. This step is optional, the transfer can be carried out by another method, for example by a mechanical and/or chemical thinning of the donor substrate by the rear face thereof.

The method continues with a step (F4) of bonding the donor substrate with a receiver substrate 40, a bonding layer 33 being at the bonding interface. This bonding layer 33 may result from the prior formation of a bonding layer on the donor substrate and/or on the receiver substrate. In a preferred embodiment, the receiver substrate integrates components such as transistors.

During a step (F5), it is then carried out, following the detachment of the donor substrate along the embrittlement plane 35, for example by supply of thermal energy. This supply of thermal energy is performed at a temperature below 500° C., preferably below 400° C.

The structure obtained after this detachment thus comprises, on the receiver substrate 40, the dielectric layer 33, the first monocrystalline semiconductor layer 32, the smoothing layer 31 and the portion 34 of the support substrate which is thus found on the surface of said structure. Alternatively, if the Smart Cut™ method is not used, this structure can be obtained by a thinning by the rear face of the donor substrate.

After the transfer, the portion of the donor substrate transferred onto the receiver substrate undergoes a finishing treatment producing a smoothing (reduction of the roughness) and a thinning allowing achieving the desired thickness for the transferred semiconductor layer.

This finishing treatment comprises, during a step (F6), a first preferably wet etching of the portion 34 of the support substrate, which is located on the surface of the structure obtained at the end of the transfer, said etching being selective relative to the material of the smoothing layer 31. For example, if the support substrate is made of silicon and the intermediate layer is of made of silicon-germanium, the etching agent may be based on TEAH or TMAH.

According to the invention, at the end of step (F6), the smoothing layer 31 is not subjected to a chemical etching, as is the case with the method of the state of the art illustrated in FIG. 1. On the contrary, according to the invention, following step (F6), the receiver substrate is inserted into an epitaxy frame and it is in this frame that the smoothing layer 31 is removed. The method according to the invention thus comprises carrying out the following steps in an epitaxy frame, namely a step (F7) of selective etching of the smoothing layer 31 relative to the first semiconductor layer 32 followed by a step (F8) of epitaxial deposition of a second semiconductor layer 36 on the first semiconductor layer 32. These steps (F7) and (F8) are carried out at a temperature less than or equal to 500° C.

Advantageously, prior to the step (F7) of selective etching of the smoothing layer 31, the method can comprise a step of removing the native oxide present on the surface of the smoothing layer 31 by wet chemical process or by plasma, as described above.

According to the invention, the surface of the first semiconductor layer 32 used to epitaxially grow the second semiconductor layer 36 is smooth on the atomic scale and free from any residual contaminant. It was indeed deposited just after the smoothing layer 31, in the ultra-clean environment of an epitaxy frame. Furthermore, since steps (F7) and (F8) are carried out in the same epitaxy frame, this surface is not exposed to contaminants since there is no re-venting. Thus this surface does not require, following step (F7) and before step (F8), the implementation of a high temperature surface preparation annealing which would be likely to degrade components integrated in the receiver substrate.

The selective etching of the smoothing layer 31 relative to the first semiconductor layer 32 is a vapour phase etching, for example with precursors such as chlorine ($Cl_2$) or hydrochloric acid (HCl). With a high partial pressure of HCl in the epitaxy chamber (in the range of 180 Torr, in a preferred embodiment), the selectivity of the etching of SiGe relative to Si is, at 500° C., greater than 40 for a rate of 20% germanium, greater than 110 for a rate of 35% germanium and even greater for a rate of 40% germanium. Even higher HCl partial pressures, in the range 200-600 Torr, can be used to benefit from such selectivities while etching the smoothing layer 31, at 500° C., at speeds of several $nm \cdot min^{-1}$.

The epitaxial deposition of the second semiconductor layer 36 can be preceded, in the epitaxy frame, by a surface preparation annealing of the first semiconductor layer 32 at a temperature less than or equal to 500° C.

The second semiconductor layer 36 can be a Si layer with a thickness typically comprised between 5 and 150 nm thick. Alternatively, the second semiconductor layer 36 can be a SiGe layer with a thickness typically comprised between 5 and 150 nm and whose germanium content is preferably comprised between 20% and 60% in order to obtain a pseudomorphic layer.

High order hydrides, such as disilane ($Si_2H_6$), trisilane ($Si_3H_8$) or tetrasilane ($Si_4H_{10}$), can be used in order to achieve, at pressures of several tens of Torr and at temperatures less than or equal to 500° C., a second semiconductor Si layer 36. Chlorinated precursors such as HCl can be injected at the same time in order to cure the growth surface, preferably by etching the defective or amorphous areas. Cyclic deposition/etching strategies, for example with $Cl_2$ as etching gas, can be used for the same purpose. For a second semiconductor SiGe layer 36, hydrogenated precursors such as silane ($SiH_4$), disilane, germane ($GeH_4$) or digermane ($Ge_2H_6$), allow achieving growth speeds of several $nm \cdot min^{-1}$ (at pressures of several tens of Torr and at temperatures less than or equal to 500° C.). Chlorinated precursors and cyclic deposition/etching strategies can be implemented, as for Si, in order to obtain smooth and monocrystalline SiGe layers.

It has been previously seen that the donor substrate could be covered with an oxide layer, the latter being intended in particular to constitute a buffer layer between the bonding interface and the remaining components to be manufactured in the second level so that said components have optimal electrical characteristics such as, for example, a low density of surface states at the interface between the active layer and the oxide layer.

One difficulty arises from the presence of the smoothing layer typically made of silicon-germanium which means that an excessive thermal oxidation budget should not be applied in order to avoid a diffusion of germanium and a stress relaxation (formation of dislocations) of the silicon-germanium layer.

The invention proposes in one possible embodiment to form a thin dielectric layer by means of a low temperature heat treatment. The method then comprises, before carrying out the assembly, a step of thermal oxidation of the first semiconductor layer 32 at a temperature below 900° C., preferably below 800° C., said thermal oxidation forming a dielectric layer with a thickness comprised between 5 nm and 50 nm which, in one possible embodiment, may be, in the step of producing the assembly, at the interface of the contacted donor and receiver substrates. This dielectric layer can be thickened by means of the deposition of a low temperature dielectric, for example SiN or $SiO_2$ deposited by PECVD. This deposition can thus be carried out at a temperature of up to 500° C. if it is carried out before the formation of the embrittlement plane by H/He implantation. It can be carried out at a temperature below 250° C. otherwise.

In another embodiment, the method may comprise, before producing the assembly, a step of plasma oxidation of the first semiconductor layer at a temperature below 500° C., said plasma oxidation forming a dielectric layer which, in one possible embodiment, may be, in the step of producing the assembly, at the interface of the donor and receiver substrates put into contact.

In order to illustrate the advantages of a production method according to the invention, the inventors carried out a campaign of comparative measurements between the methods as implemented in the prior art and the different possibilities of the invention. FIGS. 3 to 6 illustrate the AFM image of 5 µm by 5 µm of the surface of the second semiconductor layer 36 after the step of epitaxial deposition of the latter as they have been obtained during this measurement campaign.

Figure 3:
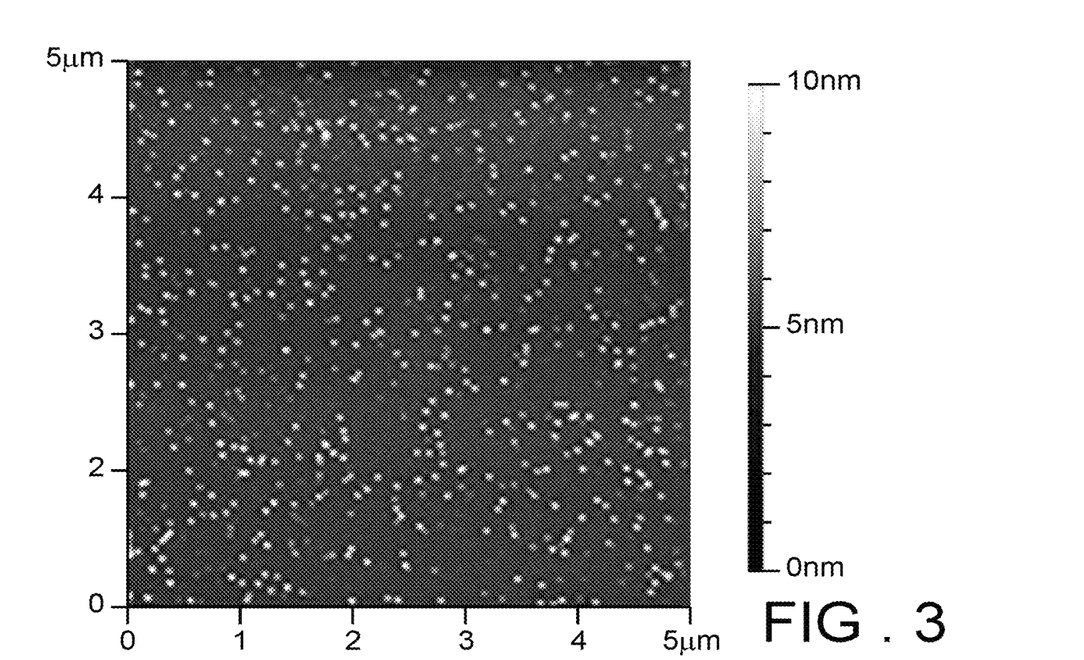
FIG. 3 illustrates an AFM image of 5 μm by 5 μm of a surface of a second semiconductor layer measured after epitaxy of the latter as part of a method of the prior art in which an etching of a smoothing layer is carried out on the outside of the epitaxy frame.

Thus, FIG. 3 illustrates the surface state of the second semiconductor layer 12 as it has been obtained when, in accordance with the prior art illustrated in FIG. 1, the step of etching the smoothing layer has been carried out outside the epitaxy frame and that there was therefore a re-venting. A certain number of protrusions (in white) are observed in this AFM image, corresponding to surface defects and/or epitaxial growth defects. As a result, the second semiconductor layer 12 has a relatively significant local topography which can be linked to the formation of polysilicon.

Figure 4:
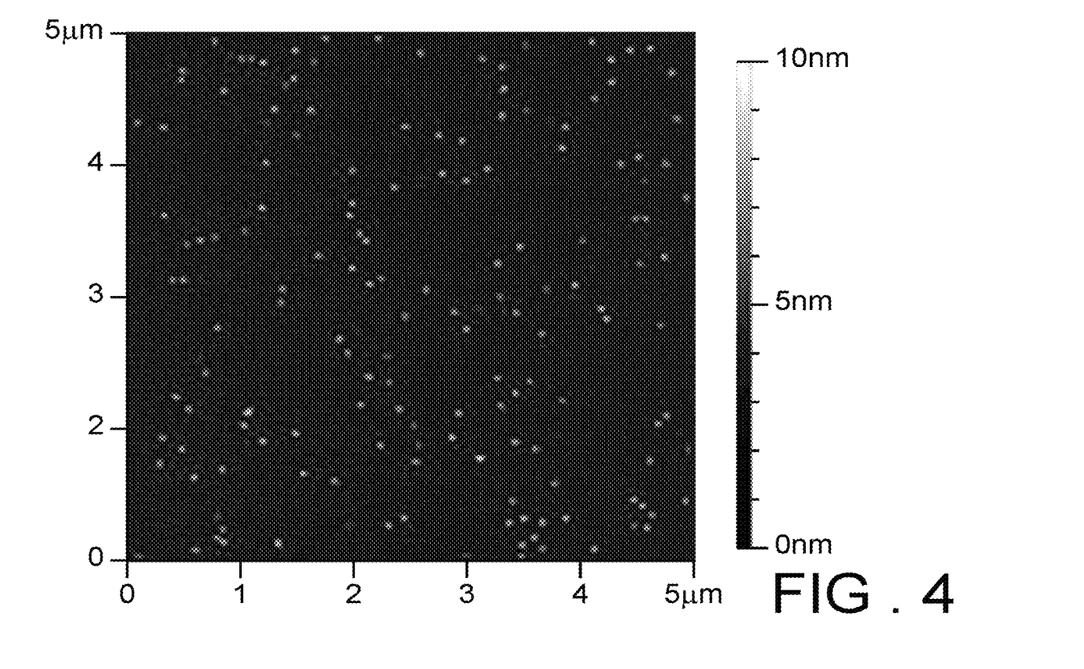
FIG. 4 illustrates an AFM image of 5 μm by 5 μm of the surface of the second semiconductor layer measured after epitaxy of the latter as part of a method according to the invention in which, in accordance with the invention, the etching of the smoothing layer is carried out in the epitaxy frame.

FIG. 4 illustrates the surface state of the second semiconductor layer 36 as it has been obtained when, in accordance with the invention, the step of etching the smoothing layer 32 has been carried out in the epitaxy frame used in the context of the deposition of the second semiconductor layer 36 without re-venting between said etching and the step of depositing the second semiconductor layer 36. It is observed, on this AFM image, a reduced number and therefore a reduced density, of protrusions relative to the prior art. Thus, the second semiconductor layer 36 has an improved local topography relative to a second semiconductor layer according to the prior art.

Figure 5:
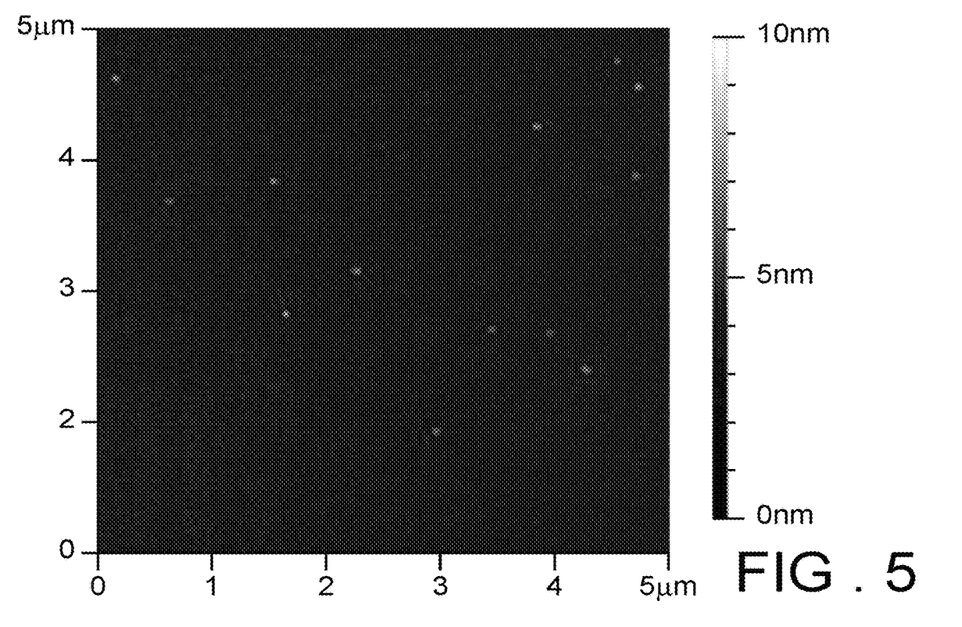
FIG. 5 illustrates an AFM image of 5 μm by 5 μm of the surface of the second semiconductor layer measured after epitaxy of the latter as part of a method according to the invention in which hydrogen chloride has been introduced as part of this epitaxy step.

FIG. 5 illustrates the surface state of the second semiconductor layer 36 as it has been obtained when, in accordance with a possibility of the invention, hydrogen chloride has been injected into the epitaxy frame during the step of depositing the second semiconductor layer 36. Such an injection of hydrogen chloride allows curing the growth surface. Thus, it is observed in this AFM image, a number, and therefore a density, of protrusions which are greatly reduced relative to a method according to the invention not implementing such an injection. Thus, according to this possibility, the second semiconductor layer 36 has a particularly improved local topography relative to a second semiconductor layer 36 according to the prior art.

Figure 6:
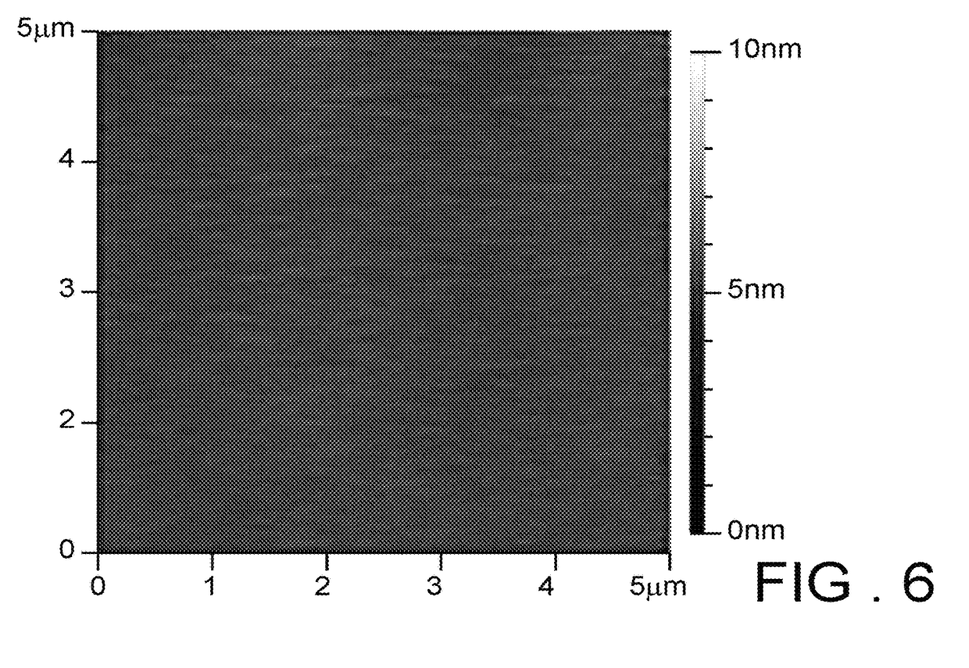
FIG. 6 illustrates an AFM image of 5 μm by 5 μm of the surface of the second semiconductor layer measured after realized after epitaxy of the latter as part of a method according to the invention in which the epitaxy step has been optimised by a cyclic deposition/etching strategy.

FIG. 6 illustrates the surface state of the second semiconductor layer 36 as it has been obtained when, in accordance with a particularly advantageous possibility of the invention, a cyclic deposition/etching strategy from a chlorine gas, herein chlorine, was implemented as part of the step of depositing the second semiconductor layer 36. It is thus observed on this AFM image that no protrusions are present showing a curing of the smoothing surface and a particularly optimised crystallographic quality of the second semiconductor layer 36. Thus, according to this possibility and as shown in FIG. 6, the second semiconductor layer 36 has an optimised topography relative to a second semiconductor layer 36 according to the prior art and to the other possibilities of the invention.

Figure 7:
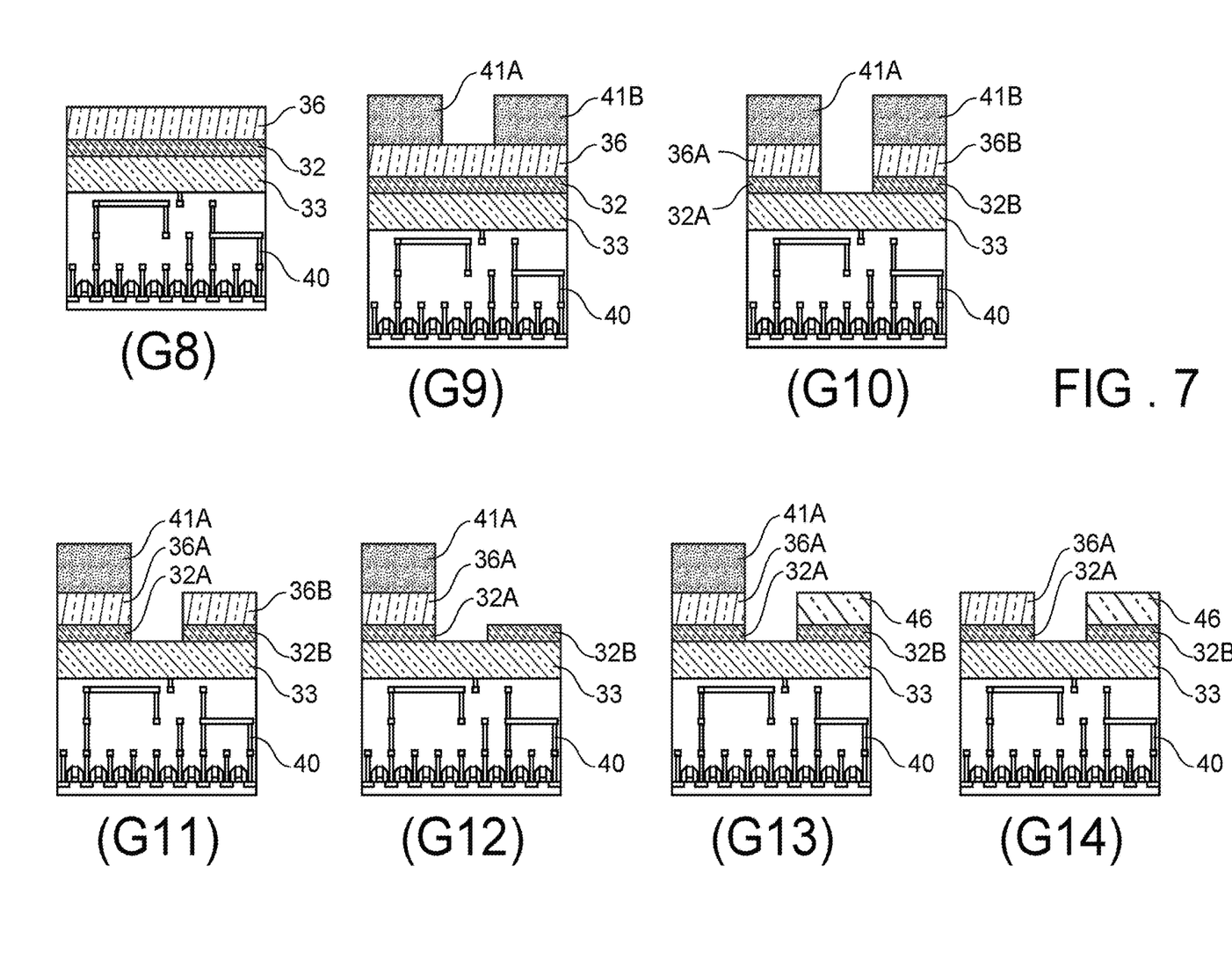
FIG. 7 illustrates a variant of the exemplary embodiment of a method in accordance with the invention in which there is provided a first PMOS component forming area according to the invention and a NMOS component forming area which is formed by subsequent epitaxy in contact with the smoothing layer.

According to a variant of the invention, illustrated by the production method shown in FIG. 7, the method according to the invention can be implemented in order to allow forming, in contact with the smoothing layer 32, 32A, 32B, a second semiconductor layer 36A of a first type in accordance with the invention and a third semiconductor layer 46 of a second type.

It will be noted that if according to the present variant of the exemplary embodiment, the first and second types of layer corresponding respectively to the second and third semiconductor layers 36A, 46 are distinguished by the composition of these layers and their conductivity type, according to the invention and without departing from the scope thereof, the materials of the second and third semiconductor layers 36A, 46 can of course be distinguished by at least one of the following characteristics:
a chemical composition,
a conductivity type,
a concentration of doping elements.

Thus, according to the present variant illustrated in FIG. 7, the second semiconductor layer 36 can be intended for the formation of a P-MOS component and comprise, for this purpose, a silicon-germanium SiGe alloy with a type of conductivity for which the majority carriers are electrons (N doping). The third semiconductor layer 46 is intended for the formation of an N-MOS component and comprise, for this purpose, silicon with a conductivity type for which the majority carriers are holes (P doping).

As shown in FIG. 7, the method according to the present variant of the invention comprises, in addition to the steps illustrated in FIG. 2 and already discussed in the context of the exemplary embodiment of the invention, the following subsequent steps:

after the epitaxial deposition step (F8 in FIG. 2, G8 in FIG. 7) of the second semiconductor layer 36, formation G9 of a mask 41A, 41B by lithography protecting a first portion 36B of the second semiconductor layer 36 corresponding to the portion 32B of the smoothing layer 32 intended to be covered by the third semiconductor layer 46 and a second portion 36A of the second semiconductor layer 36 at a distance from the first portion 36B, a third portion of the semiconductor layer 36, separating the first and second portions 36B, 36A, being free from mask 41A, 41B, localised etching G10 of the second semiconductor layer 36 and of the smoothing layer 32 in order to remove the area of the second semiconductor layer 36 and of the smoothing layer 32 which is not protected by the mask 41A, 41B, the dielectric layer 33 forming a barrier layer for the localised etching, the area of the dielectric layer thus freed from the second semiconductor layer 36 and the smoothing layer 32 separating the first and second portions 36B, 36A of the second semiconductor layer 36, elimination G11 of the portion 41B of the mask 41A, 41B covering the first portion 36B of the second semiconductor layer 36 corresponding to the portion 32B of the smoothing layer 32 intended to be covered by the third semiconductor layer 46, the portion 41A of the mask 41A, 41B covering the second portion 36A of the second semiconductor layer 36 being retained, localised etching G12 of the first portion 36B of the second semiconductor layer 36 so as to free an area 32B of the smoothing layer, the second portion 36A of the second semiconductor layer 36 and the corresponding area 32A of the smoothing layer 32 remaining protected by the remaining portion 41A of the mask 41A, 41B, epitaxial deposition G13 of the third semiconductor layer in contact with the the area 32B freed from the smoothing layer 32, the second portion 36A of the second semiconductor layer being protected by the remaining portion 41A of the mask 41A, 41B, elimination G14 of the rest of the remaining portion 41A of the mask 41A, 41B.

Advantageously and in accordance with the principle of the invention, the steps of localised etching G12 of the first portion of the second semiconductor layer 36 and of epitaxial deposition G13 of the third semiconductor layer in contact with the area 32B freed from the smoothing layer 32 can be produced in the same epitaxy frame, without re-venting and be carried out at temperatures less than or equal to 500° C.

According to this variant, it is possible to form on the same support two regions benefiting from the advantages of the invention, those corresponding to the second semiconductor layer and to the third semiconductor layer, having characteristics which are distinct from each other and thus to be able to easily combine on the same support two technology types, such as P-MOS circuits, for the region corresponding to the second semiconductor layer 36A, with N-MOS circuits, for the region corresponding to the third semiconductor layer 46.

The invention claimed is:

1. A method for producing a semiconductor-on-insulator type substrate, comprising:
    successively epitaxially depositing a smoothing layer and a first semiconductor layer on a monocrystalline support substrate to form a donor substrate, the smoothing layer forming an etching barrier layer relative to material of the support substrate;
    producing an assembly by contacting the donor substrate with a receiver substrate;
    transferring, onto the receiver substrate, the first semiconductor layer, the smoothing layer and a portion of the support substrate; and
    selectively etching the portion of the support substrate relative to the smoothing layer;
    the method further comprising, after selectively etching the portion of the support substrate, in a same epitaxy frame and without re-venting:
    selectively etching the smoothing layer relative to the first semiconductor layer; and
    epitaxially depositing a second semiconductor layer on the first semiconductor layer;
    wherein selectively etching the smoothing layer and epitaxially depositing the second semiconductor layer are carried out at temperatures less than or equal to 500° C.

2. The method for producing a semiconductor-on-insulator type substrate, according to claim 1, wherein epitaxially depositing the smoothing layer is preceded by a surface preparation annealing of the monocrystalline support substrate at a temperature greater than 650° C.

3. The method for producing a semiconductor-on-insulator type substrate, according to claim 1, wherein selectively etching the smoothing layer relative to the first semiconductor layer comprises vapour phase etching.

4. The method for producing a semiconductor-on-insulator type substrate, according to claim 1, wherein the monocrystalline support substrate is a monocrystalline Si substrate, the smoothing layer is a SiGe layer and the first semiconductor layer is a monocrystalline Si layer.

5. The method for producing a semiconductor-on-insulator type substrate, according to claim 1, wherein the monocrystalline support substrate is a monocrystalline Si substrate, the smoothing layer is a SiGe layer and the first semiconductor layer is a SiGe layer of a lower Ge concentration than the smoothing layer.

6. The method for producing a semiconductor-on-insulator type substrate according to claim 1, wherein epitaxially depositing the second semiconductor layer is preceded by a surface preparation annealing of the receiver substrate of the first semiconductor layer at a temperature less than or equal to 500° C.

7. The method for producing a semiconductor-on-insulator type substrate according to claim 1, comprising, before producing the assembly, thermally oxidizing the first semiconductor layer at a temperature less than 900° C., the thermally oxidizing forming a dielectric layer with a thickness comprised between 5 nm and 50 nm.

8. The method for producing a semiconductor-on-insulator type substrate according to claim 1, comprising, before producing the assembly, plasma oxidizing the first semiconductor layer at a temperature less than 500° C., the plasma oxidizing forming a dielectric layer.

9. The method for producing a semiconductor-on-insulator type substrate according to claim 1, further comprising, before producing the assembly, implanting ionic species in the support substrate so as to form an embrittlement plane therein and wherein the transferring comprises detaching the support substrate along the embrittlement plane.

10. The method for producing a semiconductor-on-insulator type substrate according to claim 1, wherein the receiver substrate integrates a level of microelectronic components.

11. The method for producing a semiconductor-on-insulator type substrate according to claim 1, comprising:
    localised etching a first portion of the second semiconductor layer so as to free an area from the smoothing layer; and
    epitaxially depositing a third semiconductor layer on at least one portion of the area freed from the smoothing layer.

12. The method for producing a semiconductor-on-insulator type substrate according to claim 11, wherein localised etching the first portion of the second semiconductor layer and epitaxially depositing the third semiconductor layer are performed in a same epitaxy frame, without re-venting and are conducted at temperatures less than or equal to 500° C.

13. The method for producing a semiconductor-on-insulator type substrate according to claim 11, wherein the portion of the area freed from the smoothing layer, on which the third semiconductor layer is formed, comprises a portion of the smoothing layer which is at a distance from a portion of second semiconductor layer remaining after selectively etching the first portion of the second semiconductor layer.

14. The method for producing a semiconductor-on-insulator type substrate according to claim 11, wherein there is further provided prior localised etching of the smoothing layer and of the second semiconductor layer in order to form an area free from the smoothing layer and the second semiconductor layer, the prior localised etching being prior to forming the third semiconductor layer and being carried out such that the area free from the smoothing layer and the second semiconductor layer is configured to separate the third semiconductor layer from the second semiconductor layer.

15. The method for producing a semiconductor-on-insulator type substrate according to claim 11, wherein the third semiconductor layer is made of a material distinct from that of the second semiconductor layer by at least one of the following characteristics:
    a chemical composition,
    a conductivity type, and
    a concentration of doping elements.

16. The method for producing a semiconductor-on-insulator type substrate according to claim 11, wherein the second semiconductor layer comprises a silicon-germanium alloy with a conductivity type for which majority carriers are electrons, and the third semiconductor layer comprises silicon with a conductivity type for which majority carriers are holes.

\* \* \* \* \*